US011329025B2

(12) United States Patent
Arora et al.

(10) Patent No.: US 11,329,025 B2
(45) Date of Patent: May 10, 2022

(54) MULTI-CHIP PACKAGE WITH REINFORCED ISOLATION

(71) Applicant: Texas Instruments Incorporated, Dallas, TX (US)

(72) Inventors: Vivek Arora, San Jose, CA (US); Woochan Kim, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 10 days.

(21) Appl. No.: 16/828,298

(22) Filed: Mar. 24, 2020

(65) Prior Publication Data
US 2021/0305207 A1    Sep. 30, 2021

(51) Int. Cl.
| H01L 25/065 | (2006.01) |
| H01L 23/00 | (2006.01) |
| H01L 23/31 | (2006.01) |
| H01L 23/492 | (2006.01) |
| H01L 23/495 | (2006.01) |
| H01L 21/56 | (2006.01) |
| H01F 27/40 | (2006.01) |
| H01F 27/06 | (2006.01) |
| H01L 25/00 | (2006.01) |

(52) U.S. Cl.
CPC ......... *H01L 25/0655* (2013.01); *H01F 27/06* (2013.01); *H01F 27/40* (2013.01); *H01L 21/56* (2013.01); *H01L 23/3107* (2013.01); *H01L 23/4924* (2013.01); *H01L 23/49503* (2013.01); *H01L 23/49575* (2013.01); *H01L 24/48* (2013.01); *H01L 24/92* (2013.01); *H01L 25/50* (2013.01); *H01L 2224/48195* (2013.01); *H01L 2224/92247* (2013.01)

(58) Field of Classification Search
CPC ..... H01L 25/0655; H01L 25/50; H01L 21/56; H01L 23/3107; H01L 23/4924; H01L 23/49503; H01L 23/49575; H01L 24/48; H01L 24/92; H01F 27/06; H01F 27/40
See application file for complete search history.

(56) References Cited

U.S. PATENT DOCUMENTS

| 10,559,524 B1* | 2/2020 | Naseem ................ H01L 24/85 |
| 2011/0133561 A1* | 6/2011 | Kanazawa .......... H01L 23/3121 307/75 |

(Continued)

FOREIGN PATENT DOCUMENTS

CN     110299351     10/2019

*Primary Examiner* — Nathan W Ha
(74) *Attorney, Agent, or Firm* — Ronald O. Neerings; Charles A. Brill; Frank D. Cimino

(57) ABSTRACT

A multi-chip isolation (ISO) device package includes a leadframe including leads, an interposer substrate including a top copper layer and a bottom metal layer, with a dielectric layer in-between. A first IC die and a second IC die include circuitry including a transmitter or a receiver, and first and second bond pads are both attached top side up in the package. A laminate transformer is attached to the top copper layer positioned lateral to the IC die. Bondwires wirebond the first bond pads to first pads on the laminate transformer and to a first group of the leads or the lead terminals, and bondwires wirebond the second bond pads to second pads on the laminate transformer and to a second group of the leads or the lead terminals. A mold compound provides encapsulation.

31 Claims, 4 Drawing Sheets

(56) References Cited

U.S. PATENT DOCUMENTS

| | | | |
|---|---|---|---|
| 2012/0199960 A1 | 8/2012 | Cosue et al. | |
| 2014/0131843 A1* | 5/2014 | Balakrishnan | H01L 25/0655 257/666 |
| 2014/0253225 A1* | 9/2014 | Lee | H01L 23/5227 327/535 |
| 2014/0321803 A1* | 10/2014 | Thacker | H01L 25/0652 385/14 |
| 2016/0099227 A1* | 4/2016 | Dalal | H01L 23/5383 257/774 |
| 2017/0025319 A1* | 1/2017 | Partington | H01L 23/3675 |
| 2017/0178787 A1* | 6/2017 | Massolini | H01F 41/0206 |
| 2017/0316955 A1* | 11/2017 | Tsai | B32B 37/12 |
| 2017/0317015 A1* | 11/2017 | Lee | H01L 24/41 |
| 2017/0317604 A1 | 11/2017 | Raju et al. | |
| 2019/0109061 A1* | 4/2019 | Tellkamp | H01L 23/49503 |
| 2019/0109233 A1 | 4/2019 | Tellkamp et al. | |
| 2019/0295939 A1* | 9/2019 | Ko | H01L 23/49513 |
| 2020/0248914 A1* | 8/2020 | Yagy | F24F 11/30 |
| 2020/0273782 A1* | 8/2020 | Quinones | H01L 23/49589 |
| 2020/0412148 A1* | 12/2020 | Huang | H01L 23/49541 |

\* cited by examiner

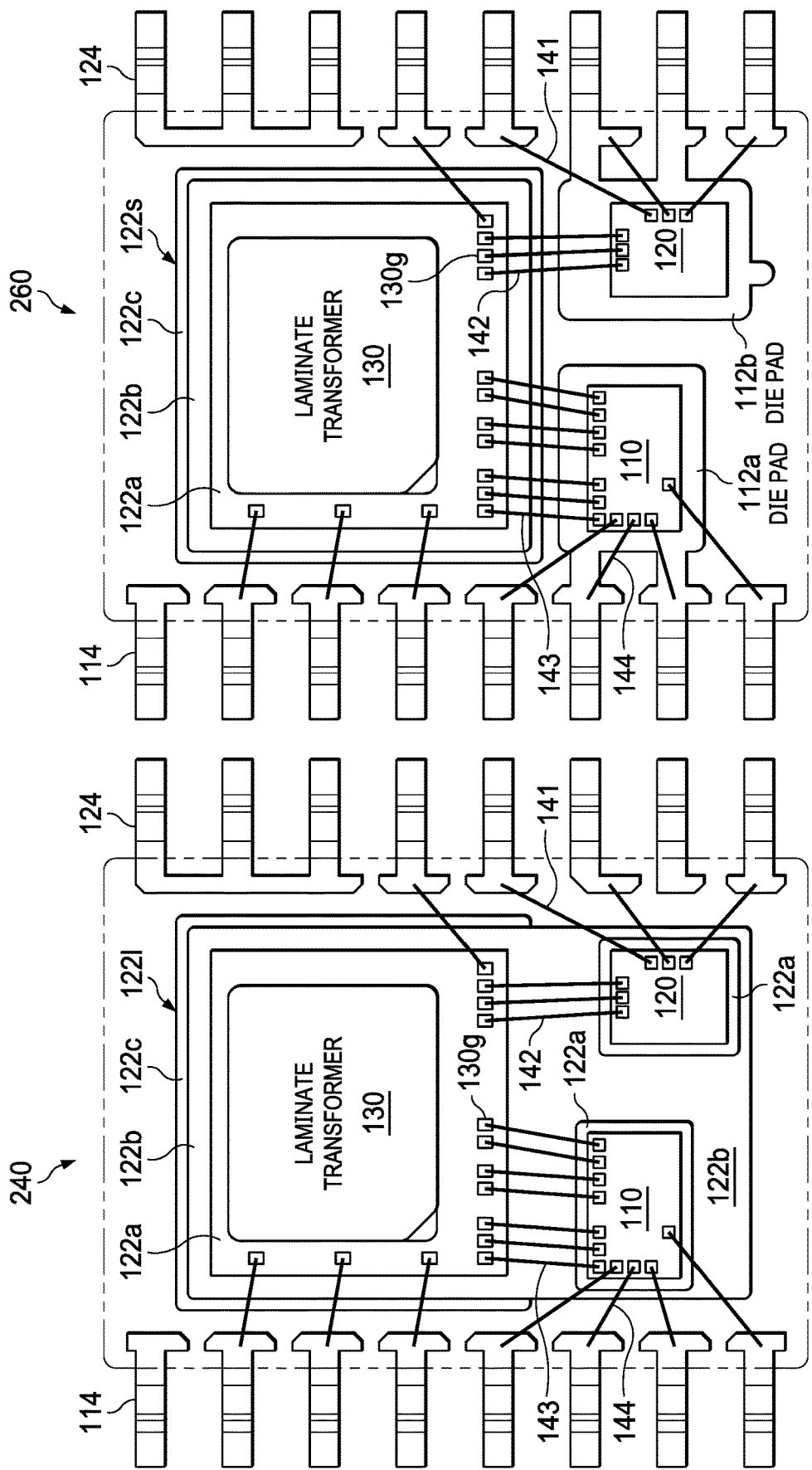

MULTI-CHIP PACKAGE WITH REINFORCED ISOLATION

FIELD

This Disclosure relates to packaged semiconductor isolation (ISO) devices, and more particularly to packaged multi-chip ISO devices.

BACKGROUND

In circuit designs for applications where high voltage (HV) is present, such as for motor control, it is generally necessary to take steps to reduce the potential risk to users of the electrical system. These steps traditionally include insulation, grounding, and the isolation of dangerous HV levels by establishing a dielectric separation from the HV. Techniques for passing signal information and power across a dielectric separation in a communication channel between integrated circuit (IC) die are known. A packaged ISO device prevents the propagation of direct current (DC) and unwanted AC currents between its input on one die and its output on the other die, while allowing the transmission of the desired AC signal between the die.

The ISO device accomplishes this function using an isolation barrier between the first and second IC die that has a high breakdown voltage and low current leakage. A high resistance path exists across the isolation barrier, but the ISO device can still transfer information encoded in the desired AC signal across the isolation barrier from one IC die to the other by capacitive coupling, inductive coupling (transformer isolation), or by optical coupling. In the case of transformer isolation, a magnetic enhanced laminate transformer is known that comprises a coil 1 (with N1 turns) and a coil 2 (with N2 turns) with magnetic field enhancing magnetic cores comprising a top magnetic core and a bottom magnetic core that typically comprise ferrite.

Some commercially available ISO devices comprise a DC/DC converter with a 5 kV root mean square (RMS) reinforced isolation rating designed to provide efficient, isolated power to isolated circuits that require a bias supply with a well-regulated output voltages. This ISO device includes a transformer and DC/DC controller that can provide 500 mW (typical) of isolated power with a high-power conversion efficiency and a low electromagnetic interference (EMI).

Where isolation is used to enable the system to function properly, but not necessarily to serve as a barrier against electrical shock, it is conventionally called functional isolation. Where the isolation provides sufficient protection against electrical shock as long as the insulation barrier is intact, it is conventionally called basic isolation. Safety regulations require basic isolation to be supplemented with a secondary isolation barrier for redundancy, so that the additional barrier provides electrical shock protection, even if the first ISO-barrier fails. This is conventionally called double isolation. To make systems comprising ISO devices compact and to save cost, it is desirable to have only one level of isolation that has the required electrical strength, reliability, and shock protection conventionally provided by two levels of basic isolation. This isolation arrangement is conventionally called reinforced isolation.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize compliance with creepage rules defined by various industrial standards such as underwriters laboratories (UL)1577, International Electrotechnical Commission (IEC)60747, and UL60950, limit the thermal dissipation capability of conventional reinforced ISO device packages (e.g., including two IC die supporting a DC/DC converter with IC die-IC die isolation) due to the absence of an exposed die pad, and thus prevents such ISO device packages from supporting high output power (e.g., >1 W) applications. The size of the ISO device package also is conventionally enlarged to meet the creepage requirements.

Disclosed aspects include a solution to the above-described problem of conventional ISO device packages with reinforced isolation packages by adding an isolated interposer substrate, such and interposer substrate including as a thermally conductive dielectric layer between top and bottom metal layers that can both be copper. A disclosed ISO device package includes a first IC die including a transmitter or receiver and a second IC die including a transmitter or receiver, with a laminate transformer providing reinforced isolation coupled between the transmitter and the receiver on the respective IC die.

Disclosed aspects include a multi-chip ISO device package includes a leadframe including leads, an interposer substrate including a top copper layer and a bottom metal layer, with a dielectric layer in-between. A first IC die and a second IC die both include circuitry including a transmitter or a receiver, and first bond pads on the first IC die and second bond pads on the second IC die are attached top side up in the package. A laminate transformer is attached to the top copper layer positioned lateral to the IC die. Bondwires wirebond the first bond pads to first pads on the laminate transformer and to a first group of the leads or the lead terminals, and bondwires wirebond the second bond pads to second pads on the laminate transformer and to a second group of the leads or the lead terminals, and a mold compound provides encapsulation for the ISO device package.

BRIEF DESCRIPTION OF THE DRAWINGS

Reference will now be made to the accompanying drawings, which are not necessarily drawn to scale, wherein:

FIG. 2D is a top view depiction example multi-chip ISO device package which includes a laminate transformer mounted onto an interposer substrate. In this arrangement, the top copper layer is a patterned layer, and the interposer substrate occupies essentially the whole area of the package so that the laminate transformer as well as the first IC die and second IC die are all on an area of the top copper layer of the interposer substrate.

FIG. 2E is a top view depiction example multi-chip ISO device package which includes a laminate transformer mounted onto an interposer substrate. In this arrangement, the interposer substrate takes up only enough area of the package so that the laminate transformer is thereon, and there are separate die pads of a leadframe for the first IC die and for the second IC die.

DETAILED DESCRIPTION

Figure 1:
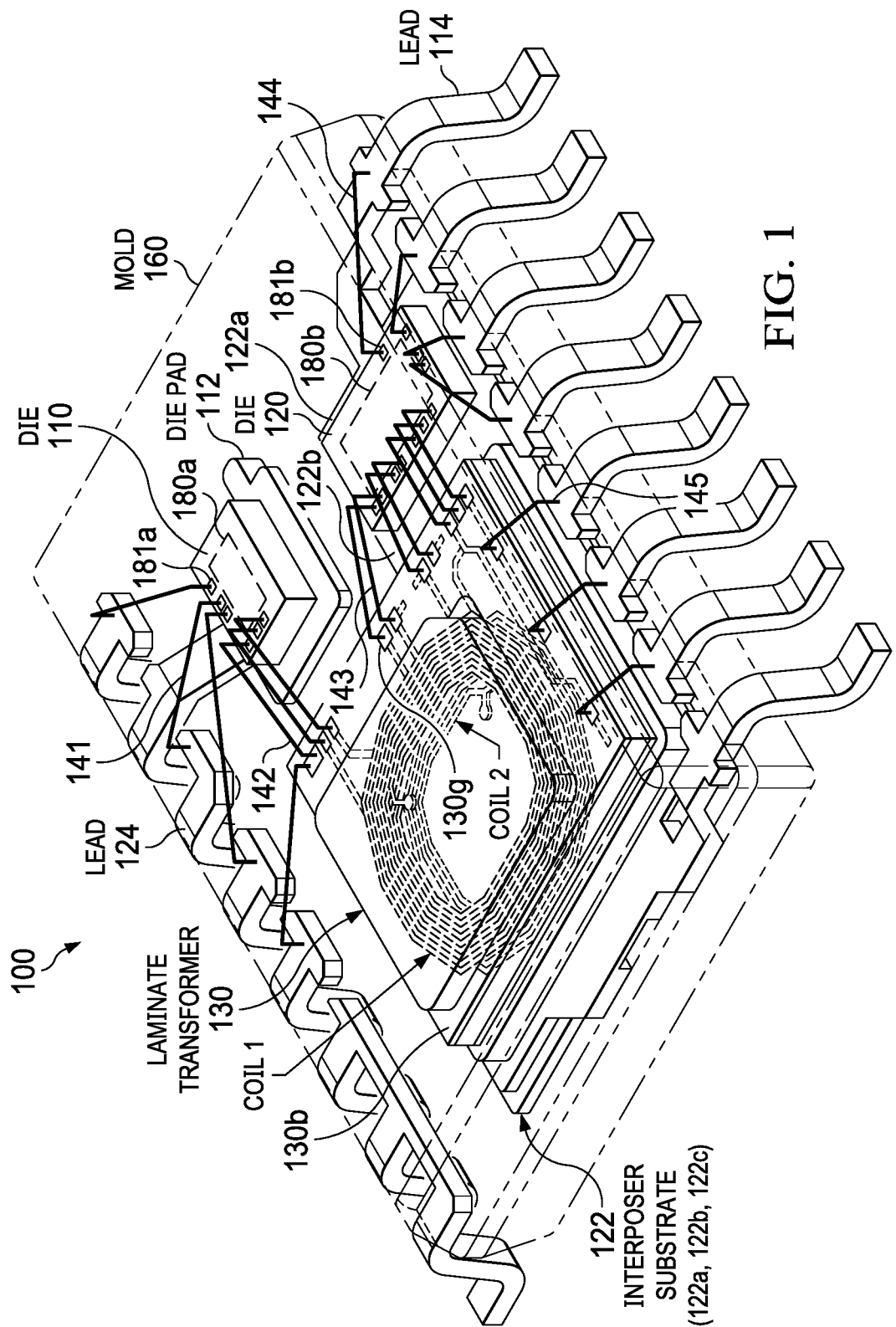
FIG. 1 is a top perspective view that shows an example multi-chip ISO device package which includes a first IC die including circuitry comprising a transmitter or a receiver, and a second IC die including circuitry comprising a transmitter or a receiver so that the package provides at least one communication channel, and a laminate transformer that is mounted to an interposer substrate that has a laminate transformer thereon that is coupled between the transmitter and the receiver of the respective IC die which provides reinforced isolation.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize the use of an interposer substrate, such as a direct bonded copper (DBC) substrate with a ceramic core dielectric layer having reasonably good thermal conductivity such as alumina or aluminum nitride, helps performance of the multi-chip ISO device package in at least 2 ways. The ceramic core material provides electrical isolation between the HV and low voltage nodes of the ISO device package within and external to the package. The generally thick top copper layer of the interposer substrate combined with the relatively high thermal conductivity of the ceramic material that the dielectric layer of the interposer substrate generally comprises help with enhanced heat dissipation which enables a higher power multi-chip ISO device package solution. Known multi-chip ISO device package solutions, such as the exposed die attach pad (DAP) small outline integrated circuit (SOIC) package, are non-isolated and generally also violate creepage requirements.

Disclosed ISO devices generally provide the smallest area package with an exposed thermal pad which meets reinforced isolation requirements. The bottom thick copper layer of the interposer substrate provides the enhanced thermal transfer capability. The bottom copper layer also enables the attachment of a heat sink which will be isolated from the first IC die and second IC die components inside the package due to the dielectric nature of the core ceramic material.

FIG. 1 is a top perspective view that shows an example multi-chip ISO device package 100 which includes a first IC die 110 including circuitry comprising a transmitter or a receiver, and a second IC die 120 including circuitry comprising a transmitter or a receiver so that the package provides at least one communication channel. The ISO device package 100 also comprises a laminate transformer 130 that is mounted to an interposer substrate 122 (e.g., a DBC substrate, such as for its dielectric layer 122b including ceramic such as Alumina ($Al_2O_3$), Aluminum Nitride (AlN), or silicon nitride) including a top copper layer 122a and a bottom metal layer 122c with the dielectric layer 122b between these metal layers.

A laminate transformer 130 is on the top copper layer 122a, where the transformer 130 is coupled between the transmitter and the receiver of the respective IC dies 110, 120 which provides reinforced isolation. The laminate transformer 130 generally supports a root mean square (RMS) breakdown voltage of at least 1 kV for a test time of one minute, typically providing a breakdown voltage of at least 2.5 kV to 5 kV. UCC12050 has a breakdown test for a minute pursuant to UL1577 which is one of the most popular standards for isolation devices.

The interposer substrate can comprise substrates besides DBC substrates, such as for example an insulated metal substrate (IMS) which can also be used as the interposer. An IMS as known in the art comprises of a metal baseplate (aluminum is commonly used because of its low cost and density) covered by a thin layer of dielectric (usually an epoxy-based layer, typically FR-4) and a top layer of copper (generally about 35 µm to more than 200 µm thick). The FR-4-based dielectric is usually provided thin (about 100 µm thick) because it has lower thermal conductivity as compared to the ceramics used in DBC substrates. As another alternate, the interposer substrate can also include an active metal brazed substrates (AMB), where a metal foil is soldered to a ceramic using a solder paste. AMB is generally a higher cost arrangement compared to DBC, but technically, AMB has essentially the same configuration as DBC.

The laminate transformer 130 generally during ISO device package operation being the hottest component in the ISO device package being attached to the top copper layer 122a of the interposer substrate 122 enables the heat generated by the laminate transformer 130 to be vertically conducted away. The heat transfer path for the ISO device package 100 is first through the top copper layer 122a, then through the dielectric layer 122b, and then finally out the bottom metal layer 122c to the ambient which functions as a heatsink for the ISO device package 100.

As noted above the dielectric layer 122b can comprise a ceramic layer, which can provide a thermal conductivity at 20° C. of at least 20 W/m·K. For example, alumina has a Thermal Conductivity at 20° C. of 28 to 35 W/m·K, aluminum nitride has a Thermal Conductivity at 20° C. of about 70 to 180 W/m·K, and silicon nitride has Thermal Conductivity of about 30 W/m·K at 20° C.

The interposer substrate 122 is shown by example for the ISO device package 100 in FIG. 1 being L-shaped to accommodate the laminate transformer 130 and the second IC die 120. In this example, the first IC die 110 is lateral to the area of interposer substrate 122, and is instead on a die pad 112 of the leadframe that is lateral to the area of the interposer substrate 122.

The interposer substrate 122 can also in some disclosed arrangements occupy essentially the whole area of the ISO device package so that the laminate transformer 130 and the first and second IC die 110, 120 are all on a patterned top copper layer 122a portion of the interposer substrate 122. This arrangement is shown in FIG. 2D described below. In another arrangement, the interposer substrate 122 takes up only enough area of the package so that the laminate transformer 130 is thereon, and there are separate die pads of a leadframe for the first IC die 110 and for the second IC die 120. This other arrangement is shown in FIG. 2E described below.

The bottom metal layer 122c can comprise copper or aluminum. The first IC die 110 which includes circuitry 180a and bond pads 181a is shown on the die pad 112, while the second IC die 120 including circuitry 180b and bond pads 181b is shown on the top copper layer 122a of the interposer substrate 122. The circuitry 180a, 180b on the IC die 110, 120 as known in the art comprises circuit elements (including transistors, and generally diodes, resistors, capacitors, etc.) formed in the semiconductor substrate, such as in an epitaxial layer on the bulk substrate material, configured together for generally realizing each at least a transmitter or receiver, with at least one of the IC die providing at least one additional circuit function. Example additional circuit functions include analog (e.g., amplifier, or a power converter), radio frequency (RF), digital, or non-volatile memory functions.

The top copper layer 122a is etched or otherwise patterned to allow electrically isolating the second IC die 120 from the laminate transformer 130. In the case that the first and second IC die 110, 120 are both on the laminate transformer 130, which is not shown in FIG. 1, the top copper layer 122a is patterned to isolate the first and second IC die 110, 120 from one another, and to provide isolation from the laminate transformer 130.

Leads are shown as 124 on one side of the ISO device package 100, and leads 114 are shown on the other side of the ISO device package 100 opposite to the leads 124. There are bondwires shown as 141 between some of the leads 124 and some of the bond pads 181a on the first IC die 110, and bondwires 142 between some of the bond pads 181a on the first IC die 110 and some of the bond pads 130g on the laminate dielectric 130b of the laminate transformer 130. As known in the art, what is shown as a laminate dielectric 130b generally comprises a laminate substrate that has multiple metal layers (levels) with via connections through a dielectric material between the respective metal layers to bring all signals to a topmost surface of the laminate substrate. Accordingly, the bondwires 142, 143 between the IC die 110, 120 and the laminate transformer 130 will generally make connections to the topmost copper layer of the laminate substrate that are connected to either the top core (shown as coil 2) or bottom core (shown as coil 1) of the laminate transformer 130.

There are thus bondwires 143 between some of the bond pads 130g on the laminate transformer 130 and some of the bond pads 181b on the second IC die 120, and some bondwires 144 between some of the bond pads 181b on the second IC die 120 and some of the leads 114. There are also bondwires 145 between some of the bond pads 130g on the laminate transformer 130 and some of the leads 114. A mold compound 160 is also shown.

Although the interposer substrate 122 is shown in FIG. 1 spanning an area of the ISO device package 100 sufficient to accommodate the laminate transformer 130 and one of the IC die shown as the second IC die 120, this need not be the case, such as in the case that the leadframe includes a first die pad and a second die pad for mounting the first IC die 110 and the second IC die 120. The top copper layer 122a of the interposer substrate 122 thus can have thereon either one of the two IC die and the laminate transformer 130, both of the IC die 110, 120 and the laminate transformer 130, or only the laminate transformer 130. In this case the top copper layer 122a is patterned, the IC die 110, 120 can both be mounted on the dielectric layer 122b of the interposer substrate 122, or one or both IC die 110, 120 can have a separate area of the top copper layer 122a on the dielectric layer 122b to provide device isolation.

It is noted that in the case that the interposer substrate 122 comprises a DBC substrate, because a DBC substrate is typically more expensive than a leadframe arrangement, it is generally better to keep the area of the DBC substrate as small if possible. An advantage of a larger area DBC substrate with all components thereon (laminate transformer 130, the first IC die 110, and the second IC die 120) is a thermal benefit. Having a large area top copper layer 122a helps the heat spreading by utilizing a larger area. Accordingly, for the ISO device package 100 there is a trade-off between cost and thermal performance.

Although the multi-chip ISO device package 100 shown in FIG. 1 includes only 2 IC die, 110, 120, disclosed multi-chip ISO device packages can have more than 2 IC die when desired. For example, 3 IC die can be included instead of only 2 IC die in one disclosed multi-chip ISO device package. Accordingly, disclosed multi-chip ISO device packages provide scalability depending on the end application.

Disclosed multichip IC device packages can generally be used for any power electronics circuit topology, not just for DC-DC converters. Examples beyond DC-DC converters can include a digital isolator, isolated flyback controller, isolated analog to digital converter (ADC), isolated gate driver, and isolated amplifiers.

Figure 2A:
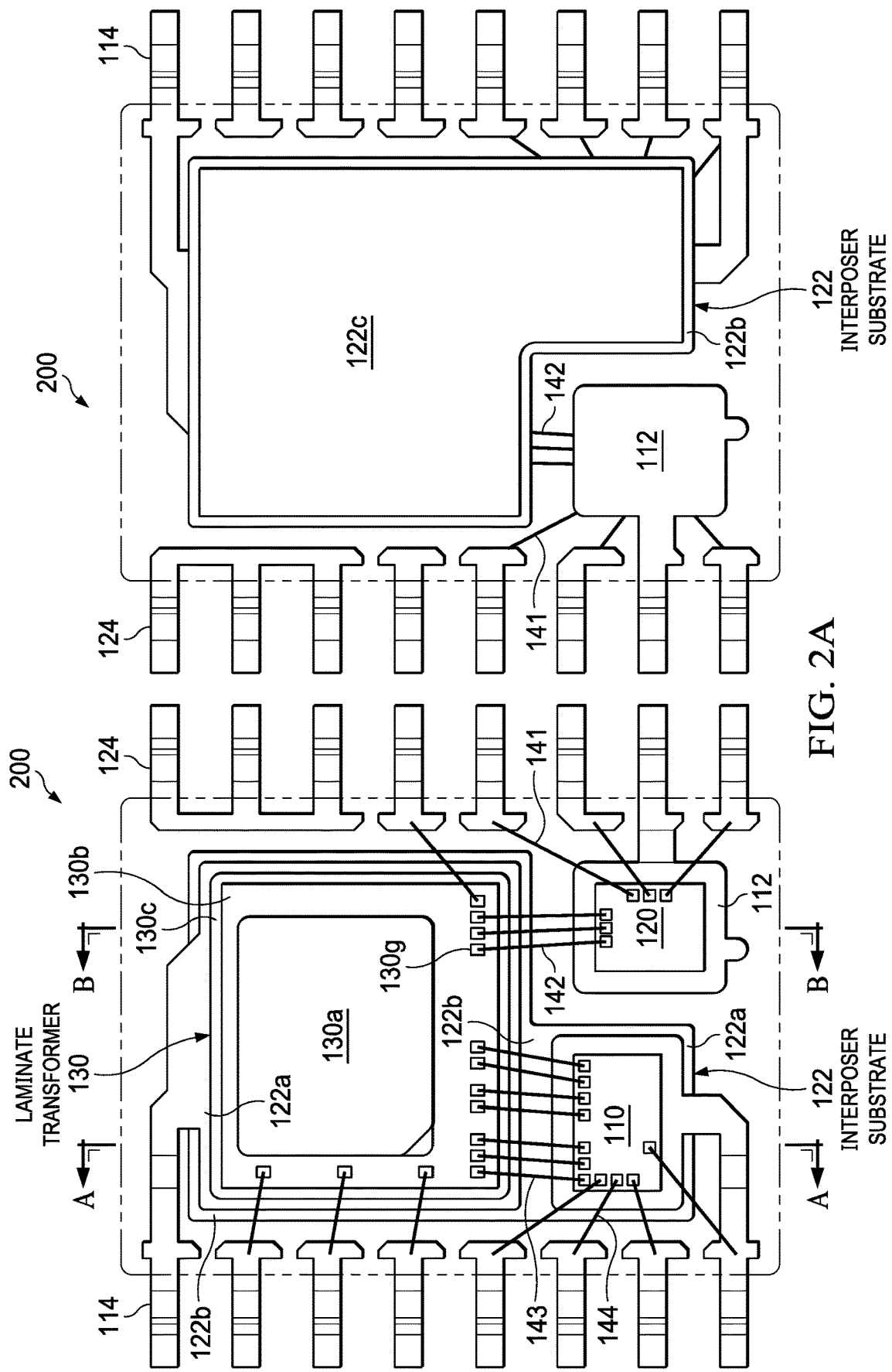
FIG. 2A is a top view depiction example multi-chip ISO device package which includes a laminate transformer mounted to an interposer substrate. The bottom view of this ISO device package provided to the right of this FIG. shows the bottom metal layer on the dielectric layer of the interposer substrate.

FIG. 2A is a top view depiction example multi-chip ISO device package 200 which includes a laminate transformer 130 mounted to an interposer substrate 122, and first and second IC die 110, 120. The laminate transformer 130 generally comprises coil 1 (with N1 turns) and coil 2 (with N2 turns) each with magnetic field enhancing magnetic cores comprising a top magnetic core 130a and a bottom magnetic core 130c (that both typically comprise ferrite) which are spaced apart from one another by a laminate dielectric shown as 130b. The bottom view of this ISO device package 200 provided to the right of this FIG. shows the bottom metal layer 122c on the dielectric layer 122b of the interposer substrate 122. In this arrangement, analogous to FIG. 1 where only one of the IC die shown as the second IC die 120 and the laminate transformer 130 are on the interposer substrate 122, the interposer substrate 122 again has an area large enough to accommodate the laminate transformer 130 as well is one of the IC die now shown as the first IC die 110, while the second IC die 120 is shown lateral to the area of the interposer substrate 122 instead being on a die pad 112 of the leadframe.

Figure 2B:
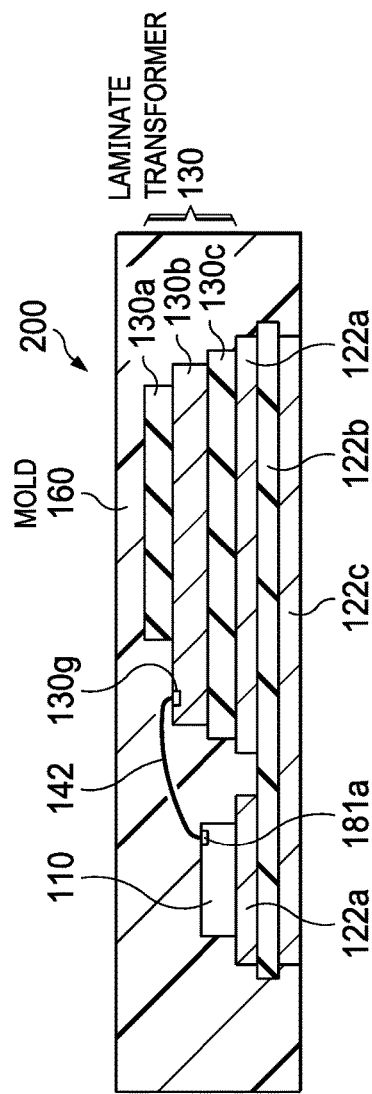
FIG. 2B is a side cross-sectional view of the ISO device package shown in FIG. 2A taken along cut line A-A shown in FIG. 2A, where the top copper layer is a patterned layer, that shows the first IC die on the top copper layer having a bond pad wirebonded to a bond pad on the laminate dielectric of the laminate transformer that is on the interposer substrate.

FIG. 2B is a side cross-sectional view of the ISO device package 200 shown in FIG. 2A taken along the cut line A-A shown in FIG. 2A, where the top copper layer 122a is a patterned layer. FIG. 2B shows the first IC die 110 on a portion of the top copper layer 122a of the interposer substrate, having a bond pad 181*a* wirebonded by a bondwire 142 to a bond pad 130*g* of the laminate dielectric 130*b* of the laminate transformer 130 that is also on another portion of the top copper layer 122*a*. A mold compound 160 is shown, where the bottom metal layer 122*c* of the interposer substrate 122 is shown exposed from the ISO device package 200 to provide enhanced cooling for the laminate transformer 130.

Figure 2C:
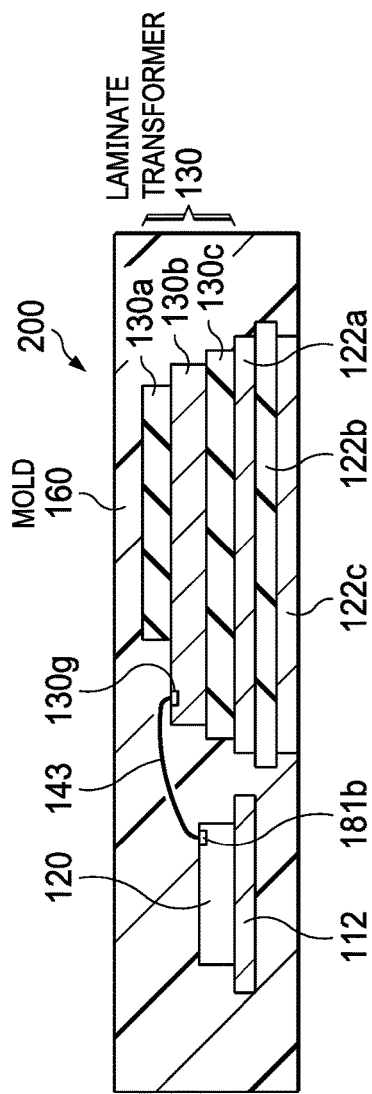
FIG. 2C is a side cross-sectional view of the ISO device package shown in FIG. 2A taken along cut line B-B shown in FIG. 2A that shows the second IC die on a die pad having a bond pad wirebonded to a bond pad on the laminate dielectric of the laminate transformer which is on the top copper layer of the interposer substrate.

FIG. 2C is a side cross-sectional view of the ISO device package 200 shown in FIG. 2A taken along cut line B-B shown in FIG. 2A that shows the second IC die 120 on the die pad 112. The second IC die 120 has a bond pad 181*b* wirebonded to a bond pad 130*g* on the laminate dielectric 130*b* of the laminate transformer 130, where the laminate transformer 130 is on the top copper layer 122*a* of the interposer substrate 122. The second IC die 120 can be seen to be lateral to the interposer substrate 122, being instead on a die pad 112 of the leadframe.

The bottom metal layer 122*c* of the interposer substrate 122 can again as in FIG. 2B be seen to be exposed from a bottom side of the ISO device package 200. Disclosed arrangements have freedom to select the cooling side of the ISO device package. For example, if the end application needs a topside cooling package, the backside of interposer substrate, such as copper for a DBC substrate, can also be exposed on topside of the ISO device package for topside heat sink attachment by flipping the view of the ISO device package 200 shown in FIG. 2C.

FIG. 2D is a top view depiction example multi-chip ISO device package 240 which includes a laminate transformer 130 mounted to an interposer substrate shown as 122*l*. In this arrangement, the interposer substrate 122*l* occupies essentially the whole area of the ISO device package 240 so that the laminate transformer 130 as well as the first IC die 110 and the second IC 120 are all on separate (patterned) areas of the top copper layer 122*a* of the interposer substrate 122*l*.

FIG. 2E is a top view depiction example multi-chip ISO device package 260 which includes a laminate transformer 130 mounted onto an interposer substrate shown as 122*s*. In this arrangement, the interposer substrate 122*s* takes up only enough area of the ISO device package 260 so that the laminate transformer 130 is thereon, and the leadframe provides separate die pads for the respective IC die, with a die pad 112*a* provided for the first IC die 110 and another die pad 112*b* provided for the second IC die 120.

Figure 3:
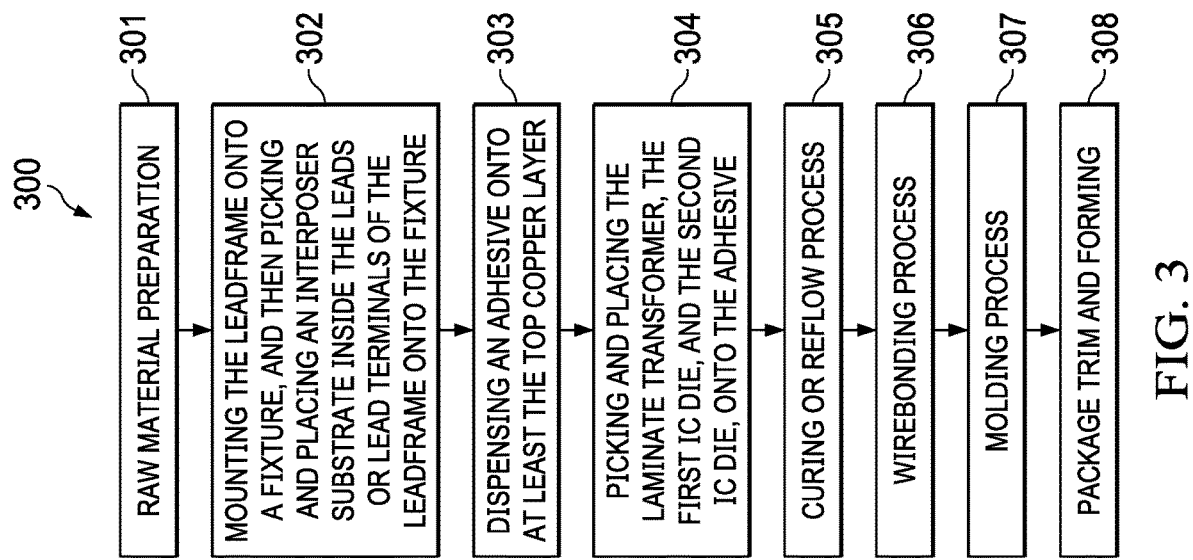
FIG. 3 is a flow chart that shows steps in an example method for forming multi-chip ISO device package that includes a laminate transformer that is mounted onto an interposer substrate, according to an example aspect.

FIG. 3 is a flow chart that shows steps in an example method 300 for forming multi-chip ISO device package that includes a laminate transformer mounted onto an isolating interposer substrate, according to an example aspect. Step 301 shown as "raw material preparation" comprises providing a first IC die 110, a second IC die 120, a laminate transformer 130, an interposer substrate 122, and a leadframe including leads or lead terminals (leads 114, 124 shown in FIG. 1) that optionally includes one or more die pad(s). Depending on the package design, as described above, the leadframe can include 0, 1, or 2 die pads, where the IC die can be either on die pads, or directly on the top copper layer of the interposer substrate where the top copper layer is optionally a patterned layer. In the case the leadframe provides no die pads (only leads or lead terminals), the interposer substrate can have an area sufficient to accommodate all the components of the ISO device package, such as shown in FIG. 2D described above.

Step 302 comprises mounting the leadframe (generally a leadframe panel/array) onto a fixture, and then picking and placing an interposer substrate inside the leads or lead terminals of the leadframe onto the fixture. The fixture can provide an accurate alignment between the leadframe and interposer substrate to enable placing the interposer substrate within an opening in the leadframe, and a tie-bar on the leadframe can be used to physically connect interposer substrates to the leadframe panel/array. This physical connection can be accomplished by using either an adhesive material along with reflow step, or using mechanical clamping. Step 303 comprises dispensing an adhesive on the top copper layer of the interposer substrate and optionally on one or more die pads. As noted above, the adhesive generally has a thermal conductivity of at least 2 W/m·K@20° C., such as least 20 W/m·K@20° C.

Step 304 comprises picking and placing the laminate transformer on the adhesive on the top copper layer of the interposer substrate, and the first IC die and second IC die on the adhesive on the top copper layer of the interposer substrate when the top copper layer is a patterned layer, or on the die pad(s) when the leadframe includes die pad(s). Step 305 comprises a curing or reflow process to cure the adhesive, such as curing at a temperature about 200° C. for about a minute. Step 306 comprises wirebonding. Step 307 comprises a molding process to form a mold compound, and step 308 comprises package trim and forming, including cutting the tie-bars of the leadframe.

Disclosed aspects can be integrated into a variety of assembly flows to form a variety of different multi-chip ISO packages and related products. The assembly can comprise configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A multi-chip isolation (ISO) device package, comprising:
   a leadframe including leads or lead terminals;
   an interposer substrate comprising a top copper layer and a bottom metal layer, with a dielectric layer positioned between the top copper layer and the bottom metal layer;
   a first IC die comprising circuitry including a transmitter or a receiver and first bond pads attached top side up in the ISO device package;
   a second IC die comprising circuitry including a transmitter or a receiver and second bond pads attached top side up in the ISO device package;
   a laminate transformer attached to the top copper layer positioned lateral to the first and the second IC die;
   bondwires wirebonding respective ones of the first bond pads of the first IC die to first pads on the laminate transformer and to a first group of the leads or the lead terminals;

bondwires wirebonding respective ones of the second bond pads of the second IC die to second pads on the laminate transformer and to a second group of the leads or the lead terminals; and a mold compound providing encapsulation for the ISO device package, wherein the bottom metal layer is exposed from the ISO device package at least under the laminate transformer.

2. The multi-chip package of claim 1, wherein the interposer substrate comprises a direct bonded copper (DBC) substrate so that the bottom metal layer comprises copper.

3. The multi-chip package of claim 1, wherein the circuitry for the first IC die or for the second IC die further comprises a DC/DC converter.

4. The multi-chip package of claim 1, wherein the laminate transformer supports a root mean square (RMS) breakdown voltage of at least 1 kV.

5. The multi-chip package of claim 1, wherein the top copper layer comprises a patterned layer.

6. The multi-chip package of claim 1, wherein the dielectric layer comprises a ceramic layer which provides a thermal conductivity at 20° C. of at least 20 W/m·K.

7. The multi-chip package of claim 1, wherein the bottom metal layer is exposed from a bottom side or a topside of the ISO device package.

8. The multi-chip package of claim 1, wherein the leadframe includes at least one die pad, and wherein the first IC die or the second IC die is attached top side up onto the die pad.

9. The multi-chip package of claim 1, wherein the leadframe includes a first die pad and a second die pad, and wherein the first IC die is on the first die pad and the second IC die is on the second die pad.

10. A method for forming a multi-chip isolation (ISO) device package, comprising:
providing a first IC die including circuitry including a transmitter or a receiver and first bond pads, a second IC die including circuitry including a transmitter or a receiver and second bond pads, a laminate transformer, an interposer substrate comprising a top copper layer and a bottom metal layer with a dielectric layer positioned between the top copper layer and the bottom metal layer, and a leadframe including a plurality of leads or lead terminals;
mounting the leadframe onto a fixture, and then picking and placing the interposer substrate inside the leads or lead terminals of the leadframe onto the fixture;
dispensing an adhesive onto at least the top copper layer;
picking and placing the laminate transformer, the first IC die, and the second IC die, onto the adhesive;
curing the adhesive;
wirebonding respective ones of the first bond pads of the first IC die to first pads on the laminate transformer and to a first group of the leads or the lead terminals, and respective ones of the second bond pads of the second IC die to second pads on the laminate transformer and to a second group of the leads or the lead terminals, and
molding processing to form a mold compound for encapsulation for the ISO device package, wherein the bottom metal layer is exposed from the ISO device package at least under the laminate transformer.

11. The method of claim 10, wherein the dispensing comprises positioning adhesive on the top copper layer when the top copper layer is a patterned layer, or on at least one die pad when the leadframe includes the die pad.

12. The method of claim 10, wherein the adhesive has a thermal conductivity of at least 20 W/m·K at 20° C.

13. The method of claim 10, wherein the interposer substrate comprises a direct bonded copper (DBC) substrate so that the bottom metal layer comprises copper.

14. The method of claim 10, wherein the top copper layer is a patterned layer.

15. The method of claim 10, wherein the laminate transformer supports a root mean square (RMS) breakdown voltage of at least 1 kV.

16. The method of claim 10, wherein the dielectric layer comprises a ceramic layer which provides a thermal conductivity at 20° C. of at least 20 W/m·K.

17. The method of claim 10, wherein the leadframe includes at least one die pad, and wherein the picking and placing comprises placing the first IC die or the second IC die top side up onto the die pad.

18. The method of claim 10, wherein the leadframe includes a first die pad and a second die pad, and wherein the picking and placing comprises placing the first IC die on the first die pad and the second IC die on the second die pad.

19. The method of claim 10, wherein the leadframe comprises a leadframe panel.

20. The method of claim 10, wherein the circuitry for the first IC die or for the second IC die further comprises a DC/DC converter.

21. The multi-chip package of claim 1, wherein the interposer substrate is not part of the leadframe.

22. The multi-chip package of claim 1, wherein the dielectric layer is not patterned.

23. A method for forming a device package, comprising:
providing a first IC die including circuitry including a transmitter or a receiver and first bond pads, a second IC die including circuitry including a transmitter or a receiver and second bond pads, a laminate transformer, an interposer substrate comprising a top copper layer and a bottom metal layer with a dielectric layer positioned between the top copper layer and the bottom metal layer, and a leadframe including a plurality of leads or lead terminals;
placing the interposer substrate inside the leads or lead terminals of the leadframe;
dispensing an adhesive onto at least the top copper layer;
placing the laminate transformer, the first IC die, and the second IC die, onto the adhesive;
wirebonding respective ones of the first bond pads of the first IC die to first pads on the laminate transformer and to a first group of the leads or the lead terminals, and respective ones of the second bond pads of the second IC die to second pads on the laminate transformer and to a second group of the leads or the lead terminals, and
molding processing to form a mold compound for encapsulation for the ISO device package, wherein the bottom metal layer is exposed from the ISO device package at least under the laminate transformer.

24. The method of claim 23, wherein the dispensing comprises positioning adhesive on the top copper layer when the top copper layer is a patterned layer, or on at least one die pad when the leadframe includes the die pad.

25. The method of claim 23, wherein the interposer substrate comprises a direct bonded copper (DBC) substrate so that the bottom metal layer comprises copper.

26. The method of claim 23, wherein the laminate transformer supports a root mean square (RMS) breakdown voltage of at least 1 kV.

27. The method of claim 23, wherein the leadframe includes at least one die pad, and wherein the placing comprises placing the first IC die or the second IC die top side up onto the die pad.

28. The method of claim 23, wherein the leadframe includes a first die pad and a second die pad, and wherein the placing comprises placing the first IC die on the first die pad and the second IC die on the second die pad.

29. The method of claim 23, wherein the leadframe comprises a leadframe panel.

30. The method of claim 23, wherein the circuitry for the first IC die or for the second IC die further comprises a DC/DC converter.

31. The method of claim 23, further including curing the adhesive.

\* \* \* \* \*